(12) United States Patent
Kim et al.

(10) Patent No.: US 7,432,652 B2
(45) Date of Patent: Oct. 7, 2008

(54) PLASMA DISPLAY DEVICE AND METHOD FOR FABRICATING A PLASMA DISPLAY DEVICE

(75) Inventors: Sok-San Kim, Cheonan-si (KR); Tae-Kyoung Kang, Asan-si (KR)

(73) Assignee: Samsung SDI Co., Ltd., Suwon (KR)

( * ) Notice: Subject to any disclaimer, the term of this patent is extended or adjusted under 35 U.S.C. 154(b) by 34 days.

(21) Appl. No.: 11/060,735

(22) Filed: Feb. 18, 2005

(65) Prior Publication Data
US 2005/0194913 A1    Sep. 8, 2005

(30) Foreign Application Priority Data
Feb. 20, 2004    (KR) .................... 10-2004-0011332

(51) Int. Cl.
*H01J 17/49*    (2006.01)
(52) U.S. Cl. .................. 313/582; 313/583; 361/681; 445/24
(58) Field of Classification Search ............. 315/169.3, 315/169.4; 349/58, 60, 150; 361/681, 801, 361/810; 345/905; 313/582, 583, 498; 445/24
See application file for complete search history.

(56) References Cited

U.S. PATENT DOCUMENTS

| | | | | |
|---|---|---|---|---|
| 5,517,208 | A * | 5/1996 | Mori et al. ................ 345/87 |
| 6,104,464 | A * | 8/2000 | Adachi et al. ............. 349/150 |
| 6,319,019 | B1 * | 11/2001 | Kwon et al. .............. 439/67 |
| 6,534,722 | B2 * | 3/2003 | Takaoka ................... 349/150 |
| 6,583,556 | B2 * | 6/2003 | Oishi et al. ............... 313/495 |
| 6,636,281 | B1 * | 10/2003 | Kanatsu ................... 349/58 |
| 6,657,620 | B2 * | 12/2003 | Oishi et al. ............... 361/681 |
| 6,677,664 | B2 * | 1/2004 | Inoue et al. .............. 349/150 |
| 2003/0058230 | A1 * | 3/2003 | Ide .......................... 345/204 |
| 2004/0017536 | A1 * | 1/2004 | Takenaka ................. 349/150 |
| 2004/0114063 | A1 * | 6/2004 | Miyamura et al. ........ 349/58 |
| 2006/0158835 | A1 * | 7/2006 | Lin et al. ................. 361/681 |

FOREIGN PATENT DOCUMENTS

| | | |
|---|---|---|
| CN | 1402319 | 12/2005 |
| JP | 2000-056701 | 2/2000 |
| JP | 2000-206898 | 7/2000 |
| JP | 2001-013883 | 1/2001 |

(Continued)

OTHER PUBLICATIONS

Chinese Office Action dated Feb. 15, 2008.

*Primary Examiner*—Douglas W. Owens
*Assistant Examiner*—Ephrem Alemu
(74) *Attorney, Agent, or Firm*—H.C. Park & Associates, PLC

(57) ABSTRACT

A plasma display device having a structure that reduces the probability of breakdown of the signal transmitting unit. The plasma display device includes a chassis base, a PDP supported in front of the chassis base, a driving circuit board that drives the PDP and is supported on a rear side of the chassis base, and a signal transmitting unit that couples the driving circuit board and the PDP by detouring the chassis base, wherein the ratio of H/W of a separation distance H with respect to a distance W between a connection portion and a vertical portion of the signal transmitting unit is $0.075 \leq H/W \leq 0.500$.

12 Claims, 7 Drawing Sheets

FOREIGN PATENT DOCUMENTS

| | | |
|---|---|---|
| JP | 2001-223445 | 8/2001 |
| JP | 2002-014625 | 1/2002 |
| JP | 2003-108017 | 4/2003 |
| JP | 2003-115568 | 4/2003 |
| JP | 2003-216054 | 7/2003 |
| KR | 1020010098816 | 8/2001 |

* cited by examiner

PLASMA DISPLAY DEVICE AND METHOD FOR FABRICATING A PLASMA DISPLAY DEVICE

CROSS REFERENCE TO RELATED APPLICATION

This application claims priority to and the benefit of Korean Patent Application No. 10-2004-0011332, filed on Feb. 20, 2004, which is hereby incorporated by reference for all purposes as if fully set forth herein.

BACKGROUND OF THE INVENTION

1. Field of the Invention

The present invention relates to a plasma display device, and more particularly, to a plasma display device having a structure that reduces the probability of damage to a signal transmitting unit.

2. Description of the Background

A plasma display device (PDD) is a flat panel display device that displays images by gas discharge. Due to its strong performance and characteristics, such as a high display capacity, high brightness, high contrast, clear image, and large viewing angle, and the fact that it may have a large thin screen, the PDD is expected to replace the cathode ray tube (CRT).

In the PDD, a plasma display panel (PDP) receives power and driving signals from a driving circuit. A tape carrier package (TCP), in which an integrated circuit (IC) is mounted on a tape, may be used as the signal transmitting unit coupling the driving circuit to the PDP. In the TCP, wires extend in a length direction of the TCP, and some of those wires may be coupled to electronic devices mounted on the TCP. A heat radiation means may be used to dissipate heat generated by the ICs when they are used as the electronic devices.

FIG. 1 is a cross sectional view showing a PDD 100 with a TCP 170.

The PDD 100 comprises a PDP 110, which includes a front substrate 111 and a rear substrate 112, disposed in front of a chassis base 120 and a driving circuit board 130 mounted on a rear surface of the chassis base 120.

A thermal conductive medium 127 may be interposed between the PDP 110 and the chassis base 120, and a dual-sided tape 123 may couple the PDP 110 to the chassis base 120. The driving circuit board 130 may be mounted on a rear surface of the chassis base 120 by fixing members 140, such as bosses.

A TCP 170, having a mounted electronic device 175, may couple the PDP 110 to the driving circuit board 130 and transmit electrical signals therebetween. A reinforcing member 150 may maintain the TCP 170 at nearly the same height as the driving circuit board 130 since the driving circuit board 130 may be elevated at a predetermined height and then connected to the PDP 110 by the TCP 170, which is formed around an edge 125 of the chassis base 120. Also, the edge 125 of the chassis base 120 may be bent toward the rear surface of the chassis base 120.

A cover plate 160 may cover a rear surface of the TCP 170 to radiate heat generated from the electronic device 175. Also, a thermal conductive sheet 182 may be interposed between the TCP 170 and the cover plate 160, and grease 181 may be interposed between the TCP 170 and the reinforcing member 150 for accelerating heat transfer therebetween.

However, during discharging in the PDP 110, thermal deformation may occur between the PDP 110 and the chassis base 120 and between the chassis base 120 and the reinforcing member 150. As FIG. 1 shows, the glass PDP 110, which has a thermal expansion coefficient of approximately 8.5 μm/m °C., and the aluminum chassis base 120, which has a thermal expansion coefficient of approximately 23.8 μm/m °C., may bend.

For example, the PDP 110 may bend approximately 6 mm when the temperature of the PDP 110 increases to 80° C. during operation.

This thermal deformation may damage the PDP 110, the chassis base 120, and the TCP 170. Particularly, when the TCP 170 expands due to the deformation, it may tear, the electronic device 175 may be damaged, and it may provide a poor electrical connection.

SUMMARY OF THE INVENTION

The present invention provides a PDD having a structure that may reduce the probability of damage to a signal transmitting unit.

Additional features of the invention will be set forth in the description which follows, and in part will be apparent from the description, or may be learned by practice of the invention.

The present invention discloses a PDD comprising a chassis base, a PDP coupled to a front side of the chassis base, a driving circuit board coupled to a rear side of the chassis base, and a signal transmitting unit coupling the driving circuit board and the PDP, wherein $0.075 \leqq H/W \leqq 0.500$. A separation distance H is a distance between the signal transmitting unit and an edge of the chassis base, and W is a distance between a connection portion and a vertical portion of the signal transmitting unit.

The present invention also discloses a method for fabricating a plasma display device, comprising coupling a plasma display panel to a front side of a chassis base, coupling a driving circuit to a rear side of the chassis base, and coupling the driving circuit to the plasma display panel with a signal transmitting unit. A length of the signal transmitting unit is determined based on a distance between the signal transmitting unit and an edge of the chassis base and a distance between a connection portion and a vertical portion of the signal transmitting unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
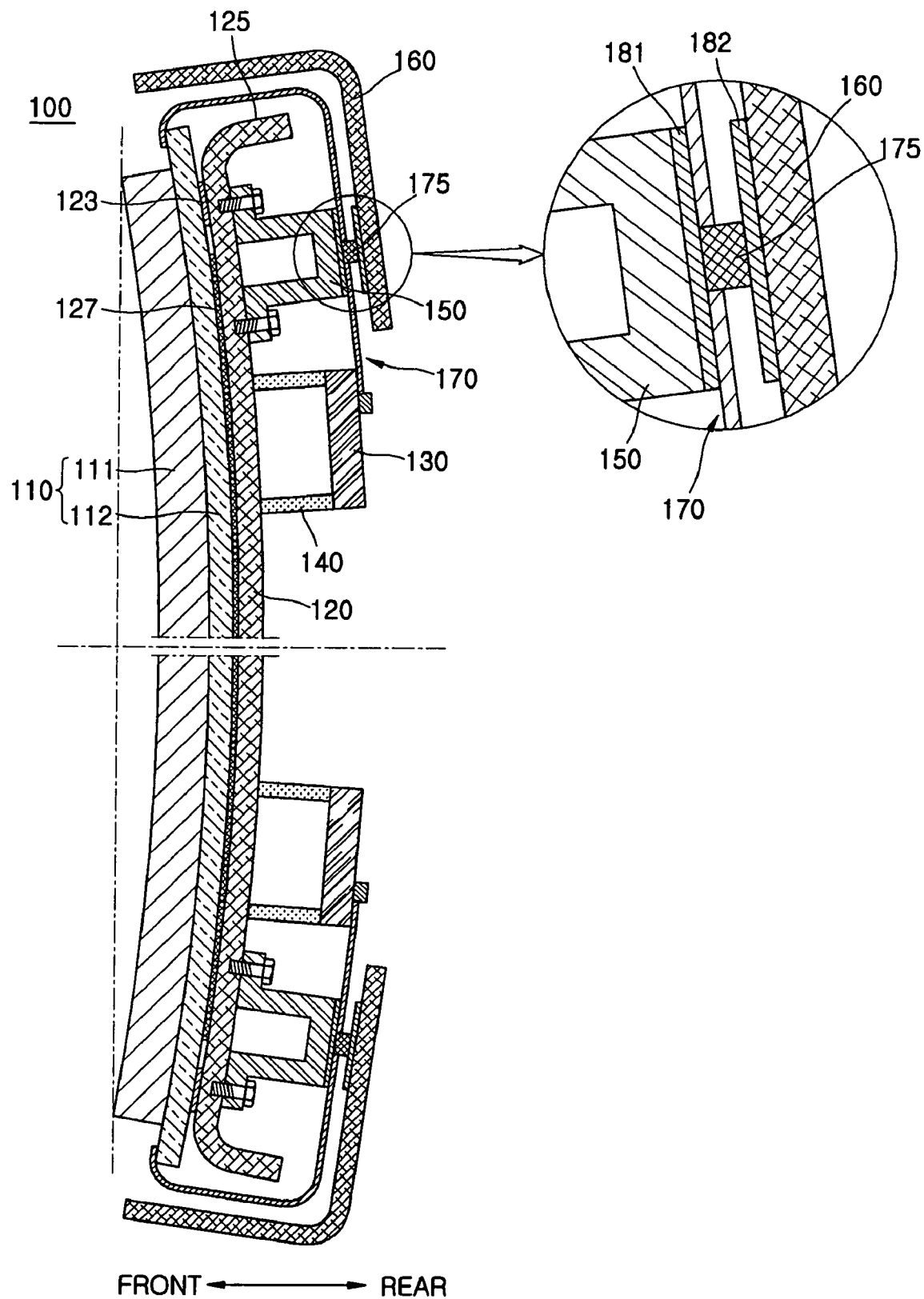
FIG. 1 is a cross sectional view showing a bent PDD due to thermal expansion.
Figure 2:
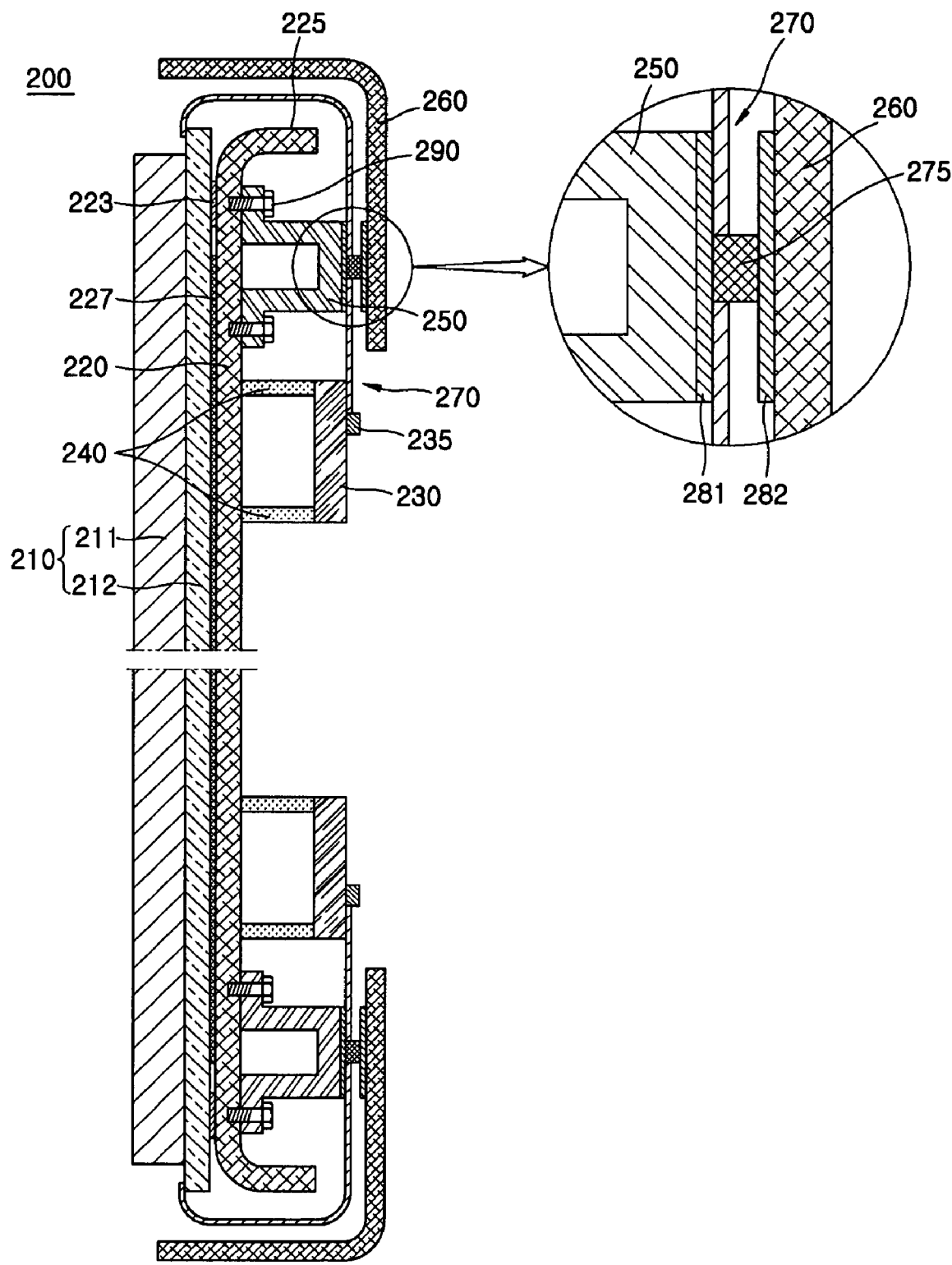
FIG. 2 is a cross-sectional view showing a PDD according to an exemplary embodiment of the present invention.
Figure 3:
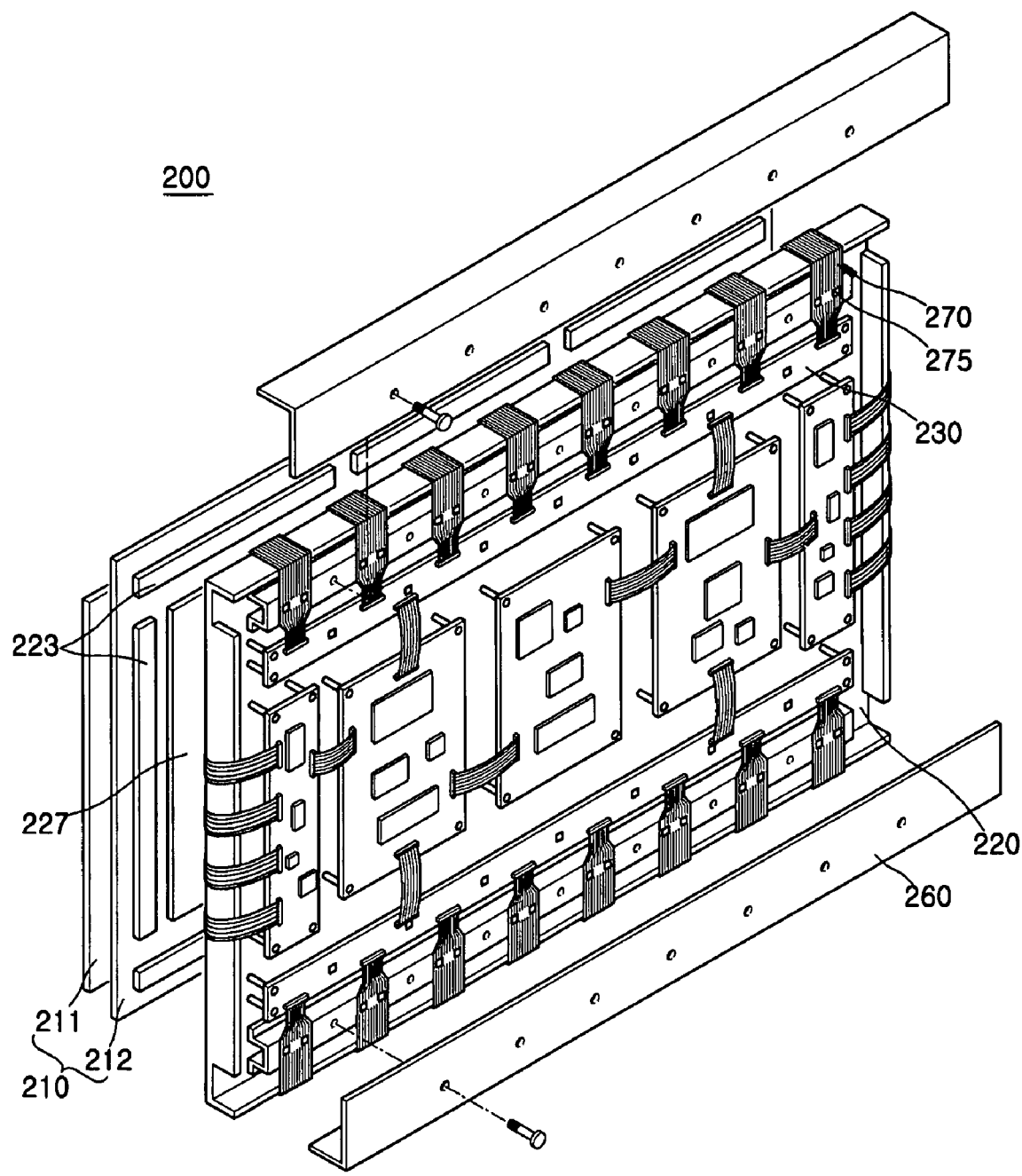
FIG. 3 is an exploded perspective view of the PDD of FIG. 2.

The present invention will now be described more fully with reference to the accompanying drawings showing exemplary embodiments of the present invention. Like reference numerals in the drawings denote like elements.

FIG. 2, FIG. 3, FIG. 4 and FIG. 5 show a PDD 200 according to an exemplary embodiment of the present invention.

Referring to FIG. 2, FIG. 3, FIG. 4 and FIG. 5, the PDD 200 includes a chassis base 220, a PDP 210 that displays an image and is coupled to a front surface of the chassis base 220, and a driving circuit board 230 that drives the PDP 210 and is coupled to a rear surface of the chassis base 220.

The PDP 210, which may be formed by coupling a front substrate 211 and a rear substrate 212, displays images using gas discharge. Though not shown, pairs of sustaining discharge electrodes may extend in a direction on a rear surface of the front substrate 211. A first dielectric layer may cover the sustaining discharge electrode pairs, and a protective layer, preferably an MgO layer, may cover the first dielectric layer. A plurality of address electrodes may be formed on a front surface of the rear substrate 212 and in a direction crossing the sustaining discharge electrode pairs. A second dielectric layer may cover the address electrodes, and barrier ribs may be formed on the second dielectric layer. Fluorescent layers may be formed in discharge cells defined by the barrier ribs. A discharge gas for plasma discharge may be filled between the front substrate 211 and the rear substrate 212.

The chassis base 220 supports the PDP 210 and may be formed of aluminum, which has a greater thermal expansion coefficient than that of the PDP 210. The chassis base 220 also radiates heat from the PDP 210. Forming the chassis base 220 of aluminum may improve the PDD's heat transfer efficiency.

A thermal conductive sheet 227 may be interposed between the PDP 210 and the chassis base 220 to transmit heat generated by the PDP 210 to the chassis base 220.

A dual-sided tape 223 may also be interposed between the PDP 210 and the chassis base 220, at different locations than the thermal conductive sheet 227, to couple the PDP 210 and the chassis base 220.

A reinforcing member 250, which reinforces the chassis base 220, may be disposed on a rear surface of the chassis base 220. The reinforcing member 250 is preferably formed of a high strength material, such as aluminum or steel, and it may be fixed to the chassis base 220 by screws 290. Alternatively, the reinforcing member 250 and the chassis base 220 may be formed as one body, thereby reducing the number of manufacturing processes and preventing bending of the PDP 210 due to relative thermal expansion of a separate reinforcing member and chassis body.

The driving circuit board 230 may be coupled to a rear side of the chassis base 220 by a fixing member 240. A boss is typically used as the fixing member 240, and the boss and the driving circuit board 230 may be coupled by a screw through a through hole of the driving circuit board 230.

Figure 5:
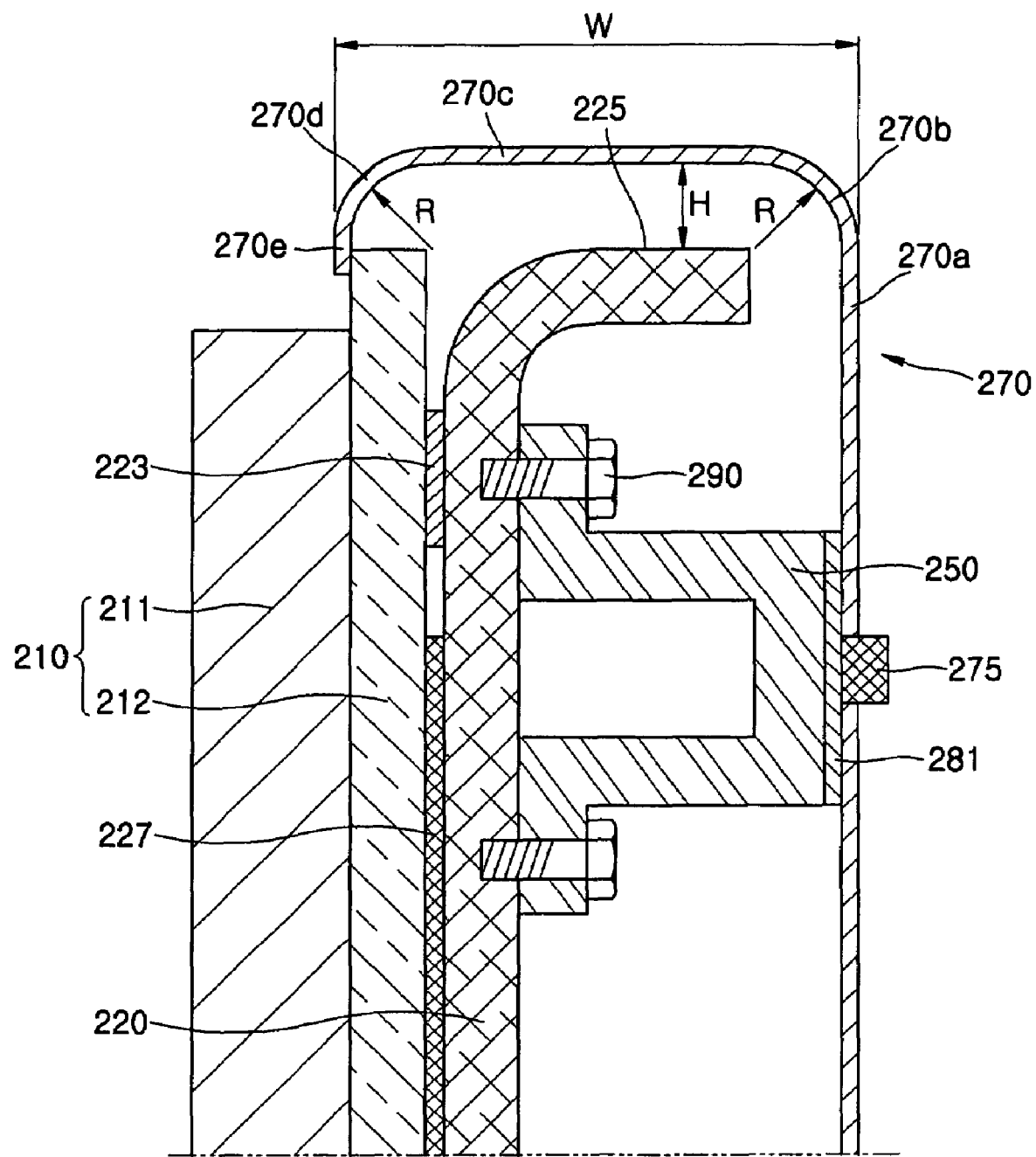
FIG. 5 is a detailed cross-sectional view of a connecting structure of the TCP in FIG. 2.

A TCP 270, which may be used for a signal transmitting unit, couples the PDP 210 to the driving circuit board 230 and transmits electrical signals and power therebetween. The TCP 270 may couple a connector 235 of the driving circuit board 230 and the PDP 210. The connector 235 may be elevated to a predetermined distance from a rear side of the chassis base 220. Therefore, the TCP 170 may be maintained at nearly the same height as the connector 235 up to an edge of the chassis base 220, and it may then run around the edge 225 before being coupled to the PDP 210. Referring to FIG. 5, the TCP 270 includes a vertical portion 270a, which is substantially parallel to the rear surface of the chassis base 220, a first curved portion 270b bent extending from the vertical portion 270a, a horizontal portion 270c extended from the first curved portion 270b and substantially parallel to an end portion 225 of the chassis base 220, a second curved portion 270d extended from the horizontal portion 270c and bent toward the PDP 210, and a coupling portion 270e extended from the second curved portion 270d and coupled to the PDP 210.

The edge of the chassis base 220 is bent toward the rear surface of the chassis base 220.

Figure 6:
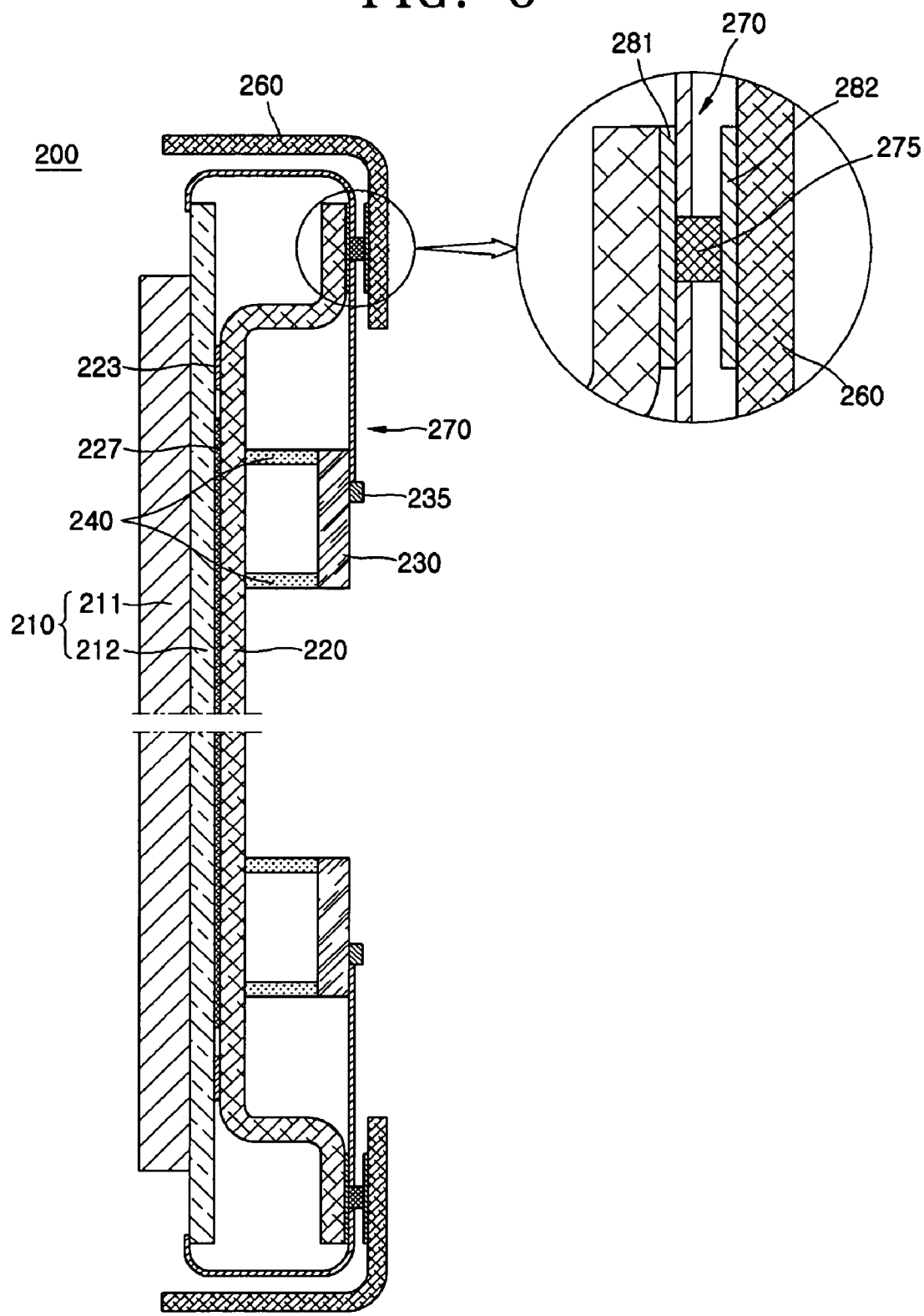
FIG. 6 is a cross-sectional view of a PDD according to an exemplary embodiment of the present invention in which a chassis base supports the TCP.

The reinforcing member 250 may support the TCP 270, but as FIG. 6 shows, the chassis base 220 may be formed to support the TCP 270.

A cover plate 260, which radiates heat generated by the electronic device 275 and shields electromagnetic waves, may be disposed to cover a rear surface of the TCP 270 having the mounted electronic device 275. Also, a thermal conductive sheet 282 may be interposed between the TCP 270 and the cover plate 260, and grease 281, which may accelerate heat radiation and mitigate a compressive force applied to the electronic device 275, may be interposed between the TCP 270 and the reinforcing member 250.

Figure 4:
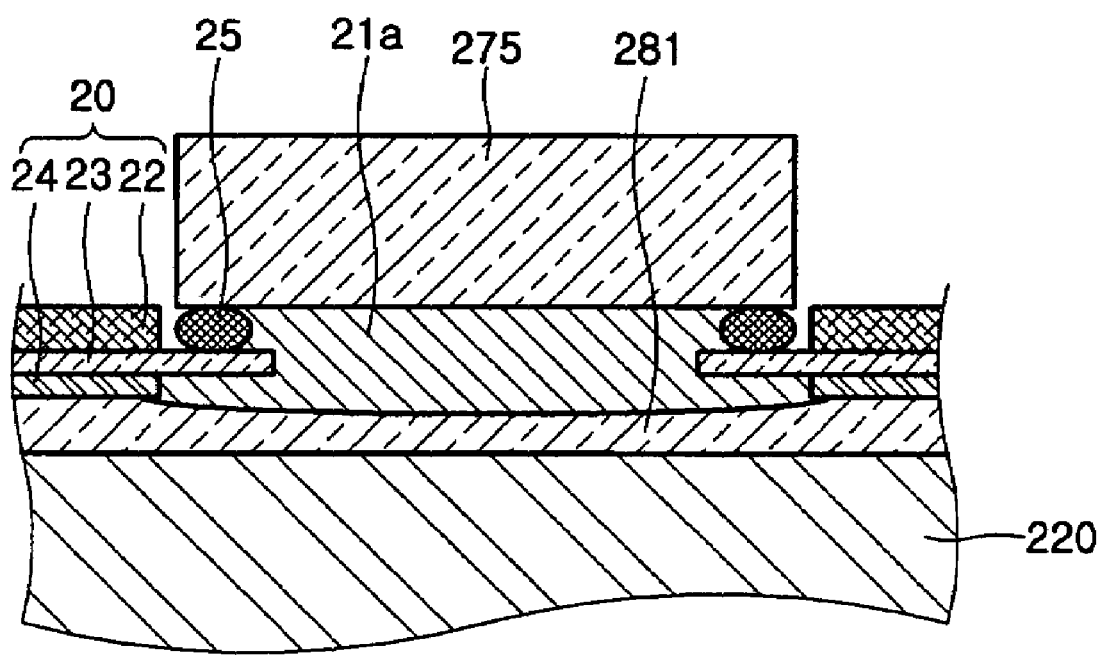
FIG. 4 is an enlarged partial cross-sectional view of the TCP in FIG. 2, on which an electronic device is mounted.

As FIG. 4 shows, the TCP 270 may include connection cables 20 and the electronic device 275 mounted on the connection cables 20. The connection cables 20 may include a base film 22, a conductive layer 23, which may be formed on the base film 22 in a length direction of the connection cables 20, and a resist layer 24, which protects and insulates the conductive layer 23. A conductive bump 25 may couple the conductive layer 23 to a circuit in the electronic device 275. A space below the electronic device 275 may be filled with an insulating resin 21a, which is preferably a material having high thermal conductivity. The insulating resin 21a may reinforce the strength of the connection between the electronic device 275 and the connection cables 20, and it may prevent disconnections of the wires due to foreign materials.

However, thermal deformation may occur between the PDP 210 and the chassis base 220 during PDP discharge operations. In this case, the TCP 270 may expand. Therefore, the TCP 270 should stably transmit signals during, and withstand damage from, thermal deformation. In the PDD 200 according to an exemplary embodiment of the present invention, the TCP 270 is coupled to the PDP 210 with a gap from the end portion 225 of the chassis base 220. Therefore, the separated portion of the TCP 270 functions to buffer the thermal expansion. Hence, as the separated distance H increases, the TCP 270 may be stably connected to the PDP 210 without being damaged.

However, a distance W between the connection portion 270e and the vertical portion 270a affects the separation distance H of the TCP 270. For example, if the distance W increases, the separation distance H may increase since the magnitude of the thermal deformation of the PDP 210 may increase as much as the increase in the distance W. That is, as the ratio of H/W increases, the TCP 270 stabilizes with respect to the thermal expansion.

Figure 7:
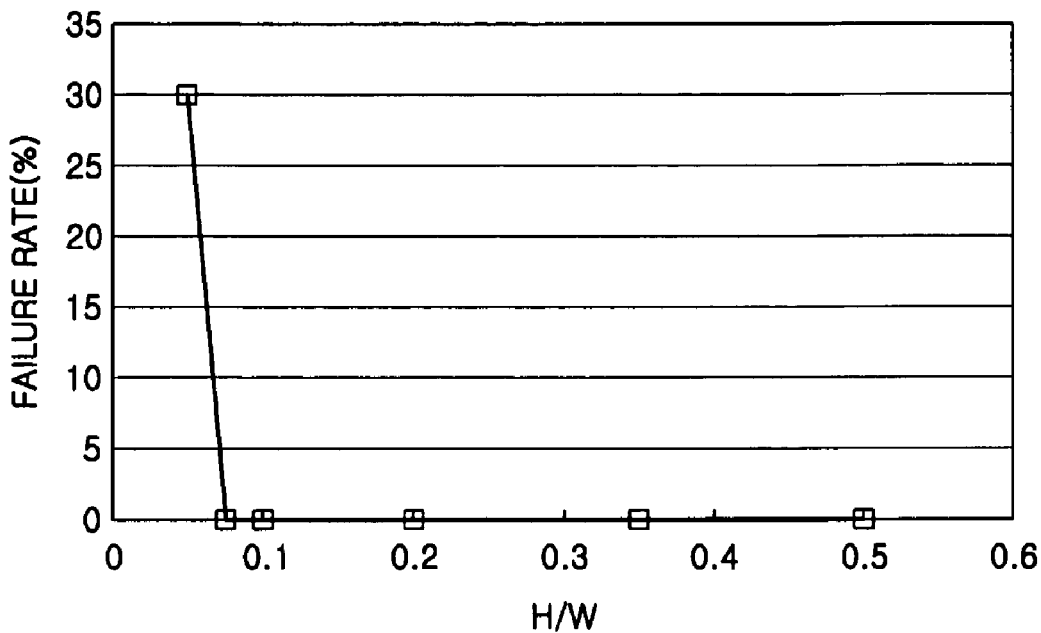
FIG. 7 is a graph showing TCP failure rates based on ratios of a separation distance to a distance between a connection portion and a vertical portion of the TCP.

FIG. 7 is a graph showing the failure rates of the TCP 270 in relation to the ratio of H/W. A 42 inch (i.e., 96 cm wide and 58 cm long) PDP 210 was tested, and ten data samples were acquired at each H/W ratio at an operating temperature of 80°

C. FIG. 7 shows the failure rate is 30% when the ratio of H/W is 0.05, and a majority of the failures of the TCP 270 are breakdowns of the electronic device and problems with transmitting signals. On the other hand, the failure rate is 0% when the ratio of H/W is 0.075-0.500. That is, increasing the separation distance H with respect to the distance W reduces the number of breakdowns of the TCP 270, even during thermal expansion, since an extra length of the TCP 270 compensates for the defamation.

However, as the separation distance H increases, the length of the TCP 270 may increase unnecessarily. The overall resistance of the conductive layer 23 may also increase since the resistance of the circuit is directly proportional to the length of the conductive layer 23. Accordingly, there is an increased risk of generating noise or distorting the signals due to this increased resistance. When the ratio of H/W exceeds 0.500, this may problematically increase the resistance of the TCP 270. Therefore, the ratio of H/W is preferably 0.075-0.500.

The TCP 270 may be formed around the end portion 225 of the chassis base 220 since it is flexible. However, if the TCP 270 is excessively bent, the conductive layer 23 of the connection cables 20 may be terminated. The problem of damaging circuits on the curved portions may occur because stress may concentrate on the first and second curved portions 270b and 270d when the PDD 200 expands. Therefore, as the radius R of curvature of a curved portion of the signal transmitting unit increases, the TCP 270 stabilizes with respect to the thermal expansion.

Figure 8:
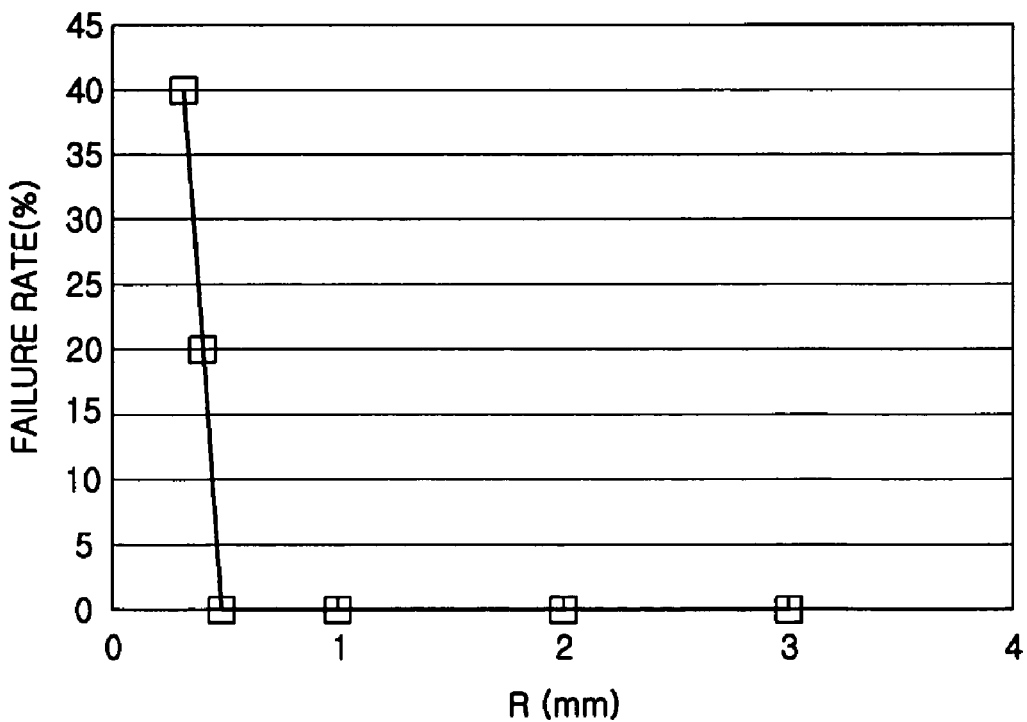
FIG. 8 is a graph showing TCP failure rates based on the radius of curvature of a surface of the TCP.

FIG. 8 is a graph showing the failure rate of the TCP in relation to the radius of curvature of a curved portion of the TCP. A 42 inch (i.e., 96 cm wide and 58 cm long) PDP 210 was tested, and ten data samples were acquired at each radius R of curvature at an operating temperature of 80° C. FIG. 8 shows the failure rate was 40% when the radius R of curvature was 0.3 mm, and the failure rate was 20% when the radius R of curvature was 0.4 mm. Signal transmission problems led to most of the failures of the TCP 270. FIG. 8 also shows that the failure rate was 0% when the radius R of curvature was about 0.5 mm or greater. That is, the radius R of curvature of a curved portion of the signal transmitting unit may be about 0.5 mm or greater to reduce the risk of breakdowns of the TCP 270 due to thermal expansion.

The present invention provides a PDD having a structure that may stably transmit signals and reduce the probability of breakdowns of the signal transmitting unit.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display device (PDD), comprising:
   a chassis base;
   a plasma display panel coupled to a front side of the chassis base;
   a driving circuit board coupled to a rear side of the chassis base; and
   a signal transmitting unit coupling the driving circuit board to the plasma display panel, the signal transmitting unit comprising a vertical portion parallel to the rear side of the chassis base and coupled to the driving circuit board, a first curved portion extending from the vertical portion, a horizontal portion extending from the first curved portion and parallel to a horizontal edge of the chassis base, a second curved portion extending from the horizontal portion, and a coupling portion extending from the second curved portion and coupled to the plasma display panel,
   wherein $0.075 \leq H/W \leq 0.500$; and
   wherein H is a distance between facing surfaces of the horizontal portion of the signal transmitting unit and the horizontal edge of the chassis base, and W is a distance between an outer surface of the coupling portion and an outer surface of the vertical portion of the signal transmitting unit, the outer surface of the coupling portion and the outer surface of the vertical portion both facing away from the chassis base.

2. The PDD of claim 1, wherein a radius of curvature of at least one of the first curved portion and the second curved portion of the signal transmitting unit is about 0.5 mm or greater.

3. The PDD of claim 1, wherein a thermal expansion coefficient of the chassis base is greater than a thermal expansion coefficient of the plasma display panel.

4. The PDD of claim 3, wherein the chassis base is formed of aluminum.

5. The PDD of claim 1, wherein the signal transmitting unit is a tape carrier package (TCP).

6. The PDD of claim 5, further comprising a reinforcing member on the rear side of the chassis base,
   wherein the reinforcing member supports the TCP.

7. The PDD of claim 6, wherein the reinforcing member is formed of one of steel and aluminum.

8. The PDD of claim 6, wherein the reinforcing member and the chassis base are formed as one body.

9. A method for fabricating a plasma display device, comprising:
   coupling a plasma display panel to a front side of a chassis base;
   coupling a driving circuit to a rear side of the chassis base;
   coupling the driving circuit to the plasma display panel with a signal transmitting unit, the signal transmitting unit comprising a vertical portion parallel to the rear side of the chassis base and coupled to the driving circuit, a first curved portion extending from the vertical portion, a horizontal portion extending from the first curved portion and parallel to a horizontal edge of the chassis base, a second curved portion extending from the horizontal portion, and a coupling portion extending from the second curved portion and coupled to the plasma display panel; and
   determining a length of the signal transmitting unit based on a distance between facing surfaces of the horizontal portion of the signal transmitting unit and the horizontal edge of the chassis base and a distance between an outer surface of the coupling portion and an outer surface of the vertical portion of the signal transmitting unit, the outer surface of the coupling portion and the outer surface of the vertical portion both facing away from the chassis base,
   wherein $0.075 \leq H/W \leq 0.500$;
   wherein H is the distance between the facing surfaces of the horizontal portion of the signal transmitting unit and the horizontal edge of the chassis base; and
   wherein W is the distance between the outer surface of the coupling portion and the outer surface of the vertical portion of the signal transmitting unit.

10. The method of claim 9, further comprising forming a radius of curvature of at least one of the first curved portion and the second curved portion of the signal transmitting unit to be about 0.5 mm or greater.

11. The method of claim 9, further comprising forming the signal transmitting unit as a tape carrier package (TCP).

12. The method of claim 11, further comprising forming a reinforcing member on the rear side of the chassis base to support the TCP.

* * * * *